US012666530B2

(12) United States Patent
Schweizer et al.

(10) Patent No.: US 12,666,530 B2
(45) Date of Patent: Jun. 23, 2026

(54) POTENTIAL-SEPARATING OPTICAL SIGNAL TRANSMITTING DEVICE

(71) Applicant: Knick Elektronische Messgeräte GmbH & Co. KG, Berlin (DE)

(72) Inventors: Lars Schweizer, Berlin (DE); Olaf Biese, Teltow (DE)

(73) Assignee: Knick Elektronische Messgeräte GmbH & Co. KG, Berlin (DE)

( * ) Notice: Subject to any disclaimer, the term of this patent is extended or adjusted under 35 U.S.C. 154(b) by 261 days.

(21) Appl. No.: 18/700,650

(22) PCT Filed: Sep. 15, 2022

(86) PCT No.: PCT/EP2022/075692
§ 371 (c)(1),
(2) Date: Apr. 11, 2024

(87) PCT Pub. No.: WO2023/066574
PCT Pub. Date: Apr. 27, 2023

(65) Prior Publication Data
US 2024/0422897 A1      Dec. 19, 2024

(30) Foreign Application Priority Data

Oct. 21, 2021    (DE) ..................... 10 2021 211 894.1

(51) Int. Cl.
*H05K 1/02* (2006.01)
*H05K 1/14* (2006.01)

(52) U.S. Cl.
CPC .......... *H05K 1/0274* (2013.01); *H05K 1/144* (2013.01); *H05K 2201/0707* (2013.01); *H05K 2201/10106* (2013.01); *H05K 2201/10121* (2013.01)

(58) Field of Classification Search
CPC ................. H05K 1/0274; H05K 1/144; H05K 2201/0707; H05K 2201/10106; H05K 2201/10121

(Continued)

(56) References Cited

U.S. PATENT DOCUMENTS

| | | | |
|---|---|---|---|
| 6,393,183 B1 | 5/2002 | Worley | |
| 2008/0292322 A1* | 11/2008 | Daghighian | ........... H04B 10/40 398/192 |

(Continued)

FOREIGN PATENT DOCUMENTS

| | | |
|---|---|---|
| DE | 69635863 | 11/2006 |
| DE | 102006010145 A1 | 8/2007 |

(Continued)

*Primary Examiner* — Andargie M Aychillhum
(74) *Attorney, Agent, or Firm* — Smartpat PLC

(57) ABSTRACT

A potential-separating optical signal transmission device comprises
  a printed circuit board-based transmitter device with a signal input, a transmission signal conditioning circuit and an optical signal transmitter,
  a printed circuit board-based receiver device with an optical signal receiver, a received signal processing circuit and a signal output,
  an optical transmission path between the signal transmitter and the signal receiver,
  a shield assembly for each transmitter and receiver device,
  an implementation of the shield assemblies by means of metallic layers in and/or on at least one printed circuit board, and
  a substantially rigid, transparent transfer rod as an optical transmission path,
    the ends of said transfer rod being arranged within the respective shield assembly of the transmitter and receiver device in front of the signal transmitter and signal receiver, respectively, and (Continued)

being mechanically held by the at least one printed circuit board.

20 Claims, 8 Drawing Sheets

(58) Field of Classification Search
USPC ........................................................ 361/784
See application file for complete search history.

(56) References Cited

U.S. PATENT DOCUMENTS

| | | | |
|---|---|---|---|
| 2009/0016673 A1 | 1/2009 | Selig | |
| 2012/0007005 A1 | 1/2012 | Schunk et al. | |
| 2013/0266277 A1* | 10/2013 | Otte ....................... | G02B 6/428 |
| | | | 385/92 |
| 2017/0195065 A1 | 7/2017 | Meier et al. | |

FOREIGN PATENT DOCUMENTS

| | | |
|---|---|---|
| DE | 102011078981 A1 | 3/2012 |
| DE | 212015000174 U1 | 2/2017 |

* cited by examiner

POTENTIAL-SEPARATING OPTICAL SIGNAL TRANSMITTING DEVICE

CROSS-REFERENCES TO RELATED APPLICATIONS

This application claims the priority, under 35 U.S.C. § 119, of German Patent Application, Serial No. DE 10 2021 211 894.1, filed Oct. 21, 2021, the content of which is incorporated herein by reference in its entirety as if fully set forth herein.

FIELD OF THE INVENTION

The invention relates to a potential-separating, optical signal transmission apparatus comprising a printed circuit board-based transmitter device with a signal input, a transmission signal conditioning circuit and an optical signal transmitter, a printed circuit board-based receiver device with an optical signal receiver, a received signal processing circuit and a signal output, an optical transmission path between the signal transmitter and the signal receiver in the form of a substantially rigid, transparent transfer rod, and a shield assembly for each transmitter and receiver device.

BACKGROUND OF THE INVENTION

With regard to the background to the invention, it should be noted that signals and energy can be transmitted in various ways via an insulating potential separation distance. Inductive, capacitive and optical separation distances are commonly used. A separation distance for signal transmission is always used if the signals could be distorted on the way, signals have to be exchanged between high potential differences, a personal protection function is necessary or for other reasons. When transporting signals over high potential differences, the signals can be distorted by capacitive and inductive coupling between the potentials.

Optical transmission paths have the advantage over capacitive and inductive transmission that the transmission channel is DC-capable. The signals are transmitted to the receiver via a transmitter and an optical transmission path. Possible interference occurs via the capacitive coupling of interference due to the different temporal potential curves between the transmitter and receiver. The optical receivers react sensitively to transient interference that occurs as potential differences and couples to the light-sensitive elements of the receiver. The interfering electrical field can be minimized by shielding and increasing the distance. Opto-couplers are one way of transmitting the signals optically. In some types, the receiver is shielded with optically transparent materials.

DE 10 2011 078 981 B4, which relates to an opto-isolator that works with a non-transparent hollow tube and has no significant shielding measures, should be mentioned as a prior art publication. US 2017/0195065 A1 discloses an opto-isolator in which a glass rod is accommodated as an optical transmission medium in a type of tubular structure with tolerances. Complex shielding bonnets designed as separate stamped and bent parts are disclosed as special shielding measures in this publication.

DE 696 35 863 T2 discloses an optical module in which a transmitter circuit for an electrical output signal is arranged on one side of a printed circuit board and a receiver circuit for the electrical input signal is arranged on the other side. These circuits are arranged in a housing with a metallic lower and upper part that acts as a shield. An optical fiber is used as the optical transmission medium.

DE 10 2006 010 145 A1 describes an optocoupler apparatus in which the transmitter and receiver are arranged on a transparent printed circuit board on the outer sides facing away from each other. The translucent printed circuit board serves as an electrical insulation and for transmitting the light signals between the transmitter and receiver.

DE 21 2015 000 174 U1 is the closest publication, as it discloses an optocoupler the transmitter and receiver of which are arranged on separate printed circuit boards and are connected between these two printed circuit boards via a glass rod surrounded by a supporting structure. Shielding is also mentioned. A potential-separating optical signal transmission apparatus cited above is thus known from this publication, which comprises

- a printed circuit board-based transmitter device with a signal input, a transmission signal conditioning circuit and an optical signal transmitter,
- a printed circuit board-based receiver device with an optical signal receiver, a received signal processing circuit and signal output,
- an optical transmission path between the signal transmitter and signal receiver, which is designed as a substantially rigid, transparent transfer rod, and
- a shield assembly for each transmitter and receiver device.

The optical signal transmitters and receivers can be implemented with any semiconductor-based light emitters and light-sensitive receivers.

The shields used in some optocouplers of this type do not have sufficient shielding for high transient voltages between the transmitter and receiver of the optical interface and therefore have insufficient common mode rejection. To improve common mode rejection, the distance between the transmitter and receiver and/or the amount of light transmitted can be increased and/or the shielding improved.

SUMMARY OF THE INVENTION

In practice, however, the above possibilities are limited to the extent that the available space and energy are often restricted. In this respect, it is an object of the invention to provide an optical signal transmission apparatus which, with optimized shielding and transmission properties, high resistance to ageing and environmental influences, has a compact, mechanically simple structure and only low energy requirement.

This object is achieved in combination with the features of the preamble by the following features, namely

- an implementation of the shielding assemblies by metallic layers in and/or on at least one printed circuit board, and
- a rigid, transparent transfer rod as an optical transmission path, the ends of said transfer rod being arranged shortly in front of or within the respective shield assembly of the transmitter and receiver device in front of the signal transmitter and signal receiver thereof, respectively, and being mechanically held by the at least one printed circuit board.

The transfer rod has the function of an optical fiber. This basic concept makes it possible to achieve various product and application-related advantages, such as a cost-optimized solution, a very long service life, medium to high insulation distances, no damage to the insulation due to transient displacement currents or high field strengths in the application environment of the signal transmission apparatus, very high common mode rejection, DC-capable signal transmission, extremely low influence of environmental conditions on the apparatus and a medium to high signal bandwidth. This makes the subject-matter of the invention particularly suitable, for example, for applications in the field of isolation amplifiers for analogue or digital signals, temperature measurement, pulse signal multipliers, bus couplers or digital signal isolation and in particular in the fields of railway applications, HV-DC applications, test rigs, test benches or other safety-related applications.

In contrast to the use of sheet metal bonnets as shielding elements, which are large in volume and can only be implemented at high production effort, in particular in the case of multiple shields, the shield assemblies in the form of metallic layers in and/or on the printed circuit board are much easier to manufacture if they are highly effective.

The further provided transparent transfer rod has the advantages of low ageing sensitivity, low attenuation, low coupling and decoupling losses, mechanical robustness, insensitivity to climatic influences, low stray light decoupling, controllable linear expansion, low costs and simple mounting.

Signals can be transmitted via the transfer rod in various ways, such as an intensity of the light that is directly proportional to the amplitude of the signal, a modulation of the signal such as frequency modulation or amplitude modulation or as a digital signal. As a distance between the maximum signal frequency and the modulation frequency must always be maintained when modulating the signal, direct, proportional transmission of the signal with a larger bandwidth compared to a modulated signal is possible with the limited bandwidth of the optical channel. The optical signal can be transmitted in several stages. One signal level corresponds to a logical high level, another signal level corresponds to a logical low level and no optical signal is transmitted in the event of an error. Avoiding a drop to zero in fault-free operation minimizes the response time of the optical elements. The zero signal can be used favorably in the field of functional safety.

Preferred further embodiments of the invention are set forth hereinafter. Thus, the signal transmission apparatus with a transmitter device, an optical transmission path and a receiver device can be implemented by combining three printed circuit boards which sit on top of each other, namely a base printed circuit board with at least the majority of the electronic circuit components thereon, a frame printed circuit board for laterally framing the circuit components and a cover printed circuit board for covering the frame printed circuit board, the circuit components and the transfer rod, wherein preferably the metallic layers of the shield assemblies for the transmitter and receiver device are arranged in or on the base, frame and cover printed circuit board in such a manner that in each case at least single- or multilayer, in particular double-layer shields are formed around the transmitter and receiver device with their electronic circuit components, which are penetrated by the transparent transfer rod on the side of the transmitter or receiver device.

As an alternative to the 3-layer structure including base, frame and cover printed circuit board, the last two elements mentioned can also be implemented in one piece by means of a cap printed circuit board, which has a circumferential frame flange to frame the circuit components at the side and a cover wall to cover the circuit components and the transfer rod. The frame flange is formed by one or more corresponding recesses in the thicker printed circuit board blank.

This embodiment has the advantage that mounting the signal transmission apparatus can be carried out more efficiently due to the smaller number of parts, which more than compensates for the increased manufacturing effort for the cap printed circuit board.

With regard to both of the above alternative embodiments, it should be noted that the actual electronic circuits, electrical shielding and the encapsulation of the optical fiber are thus advantageously implemented in a quasi-integral design with the aid of printed circuit boards stacked on top of each other, namely the base, frame and cover printed circuit board or the base and cap printed circuit board. The connections required for the function between the components assembled on a layer 1 can thus be established in the base printed circuit board. All components that do not need to be shielded and whose signals are filtered when they enter the shielded area can be placed on the underside of the base printed circuit board. The connections to external systems can also be established via the base printed circuit board.

The frame printed circuit board or the frame flange of the cap printed circuit board defines the maximum height of such components that can be fitted on the base printed circuit board and must be located within the shields. The cover printed circuit board or the cover wall of the cap printed circuit board closes the shield and protects the optical channel from contamination.

According to a further preferred embodiment, the base and cover printed circuit board or cover wall are provided with metallic layers arranged parallel to their main planes and the frame printed circuit board or frame flange is provided with metallic layers arranged at the edges running at right angles to the main plane to implement the shielding.

The components mounted on layer 1 of the base printed circuit board are thus enclosed and shielded below and above the latter by the metal layers in the base and cover printed circuit board or cover wall and laterally by the edge-metallized frame printed circuit board or the edge-metallized frame flange. The shielding coverage can be significantly improved with the aid of the edge metallization on the frame printed circuit board or frame flange.

The transparent transfer rod can advantageously have at least one of the following properties:
  made of a highly transparent synthetic resin or glass, preferably quartz glass,
  length between 10 mm and 100 mm, preferably 20 mm, diameter 1 mm to 4 mm, preferably 2 mm,
  distance of the signal input and output surfaces on the head side to the signal transmitter and signal receiver between 0.1 mm and 1 mm, preferably 0.5 mm and/or
  optical preparation or finishing of the signal input and output surfaces on the head side.

It is understood that the transfer rod can also have a suitably designed cladding that enables improved guidance of the light even under unfavorable operating conditions and unfavorable mechanical assembly. Such claddings can be designed in such a manner that a favorable gradation or a favorable spatial course of the refractive indices of a light-conducting core and the cladding is achieved. The optical path can thus be designed in such a manner that degradation of the light output over the service life of the device at the optical receiver is minimized and any influence on the optical receiver due to common mode interference or other EMC interference is minimized. The light is emitted by the transmitter, enters the optical fiber via the air and from the optical fiber via the air into the optical receiver. The air transition from the transmitter to the transfer rod and from the transfer rod to the optical receiver is particularly susceptible to contamination, which can be prevented by encapsulating the transmission path and/or by inserting an optical interface material.

An optical interface material must preferably have little influence on the transmission of light and involve low ageing of the transmission. The application of the interface material can preferably be omitted by encapsulating the entire system using the printed circuit board design.

The fiber optic cable can be made of various optical materials. As long-term stability is important in this application, no ageing-sensitive material is selected as the optical fiber, but a transfer rod made of ageing-resistant, highly transparent plastic, such as polycarbonate, is used at best, but glass, such as natural quartz glass, is particularly preferred. The glass rod has a length of 20 mm+/−0.5 mm and a diameter of 2 mm+/−0.1 mm. The glass rod can be scored and broken. Processing or finishing of the optical input and output surfaces is possible, but not necessary. Turbidity due to the influence of humidity and temperature is negligible with a glass rod. The wavelength of the transmitter, the wavelength-dependent attenuation of the optical fiber and the wavelength-dependent sensitivity of the receiver are naturally matched to each other. The distance between the transmitter and receiver, and therefore the level of isolation, is almost freely selectable due to the low losses of the optical path.

According to another preferred embodiment, the transfer rod is arranged in a recess in the frame printed circuit board or the frame flange and/or is held by a press fit via projections on the frame printed circuit board or the frame flange. The glass rod is mounted due to this design in such a manner that the rod does not break under load and that the temperature-induced linear expansion and torsion of the housing can be compensated for. This mounting prevents microphonic effects and damage caused by vibration or torsion, which could lead to breakage of the optical fiber. In addition, there are no relevant light losses due to excessive contact surfaces of the transfer rod and manufacturing tolerances can be considered. Stops to protect the optical components from vibration are conceivable. As no adhesives are used for mounting the transfer rod, transmission losses, ageing phenomena and limited environmental resistance are avoided.

Furthermore, the transfer rod can preferably lie in an alignment recess in the surface of the base printed circuit board, so that the optical axes of the transmitter and receiver are virtually "automatically" aligned with the center of the transfer rod.

An advantageous further embodiment of the signal transmission apparatus is that the signal transmitter is designed as a light-emitting semiconductor component. Laser diodes or LEDs, for example, are suitable here. Particularly suitable is the use of an LED whose ageing can preferably be compensated for by adjusting the LED current by means of an ageing compensation circuit based on a reference LED transmission path. With this measure, the greatest disadvantage when using LEDs, namely their ageing, can not only be minimized to a small extent by utilizing the nominal current of the LED, but can also be compensated to a high degree by automatically adjusting the LED current. A second LED, which is operated under the same or similar conditions, can be used as a reference for controlling the current of the emitting LED. If both LEDs are close together, they are loaded with the same temperature profile. The current of the reference LED is set to the average expected current of the emitting LED or the same current flows through both LEDs. The reference LED then casts its light onto an optical receiver, which controls the current of the emitting LED.

The signal receiver can preferably be designed as a CCD, phototransistor, photodiode or photoresistor. A large transmission bandwidth, suitable receiver surfaces, good economic availability, simple assembling preferably in SMD design, large temperature range, suitable sensitivity and dynamics, good climate resistance, suitable wavelength range and spectral sensitivity are parameters for the selection of a suitable signal receiver.

Finally, in another preferred embodiment of the invention, the base, frame and cover printed circuit board or the base and cap printed circuit board can be mechanically connected to one another in the manner of a sandwich structure, preferably by means of soldering pins, soldered edge metallizations, press-fit pins, adhesions, pressings, screwing, riveting or welding. In this manner, high torsional rigidity of the assembly is achieved so that, for example, when screwing cables into the connection terminals of the signal transmission apparatus, no significant loads are exerted on sensitive components, such as the transfer rod or ceramic capacitors in particular, and partial vibrations are suppressed.

Further features, details and advantages of the invention are apparent from the following description of embodiment examples with reference to the accompanying drawings.

DESCRIPTION OF THE PREFERRED EMBODIMENTS

Figure 1:
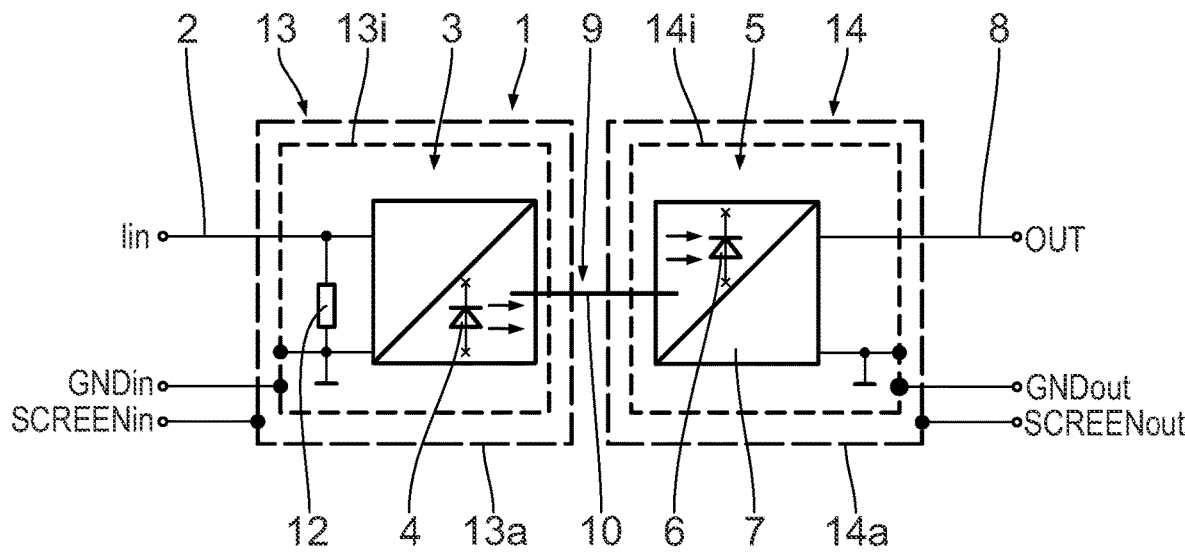
FIG. 1 and FIG. 2 show rough overview block diagrams of a potential-separating optical signal transmission apparatus for current or voltage signals.

As can be seen from FIG. 1, a potential-separating optical signal transmission apparatus has a transmitter device 1 with a signal input 2, an input ground connection GNDin, a transmission signal conditioning circuit 3 and an optical signal transmitter 4 in the form of an LED. On the receiver side, a receiver device 5 is provided with an optical signal receiver 6 in the form of a photodiode, a received signal processing circuit 7, a signal output 8 and an output ground connection GNDout. An optical transmission path 9 is provided between the signal transmitter 4 and the signal receiver 6, which is implemented by an essentially rigid, transparent transfer rod 10.

The signal input 2 is configured for a current signal lin. Accordingly, an input resistor 12 is connected between the signal input 2 and the input ground connection GNDin the signal transmission apparatus.

As shown in dashed lines in FIG. 1, shields 13, 14 are arranged around the transmitter device 1 and receiver device 5 respectively, each of which is designed as a double shielding including an inner shield 13*i*, 14*i* and an outer shield 13*a*, 14*a*. This double shielding is particularly advantageous for the current signal input 2 shown, as in this case the input ground GNDin, to whose potential the inner shield 13*i* is connected, changes its potential in relation to the environment and potential differences arise accordingly. Effective shielding is provided by the outer shield 13*a*, whose potential SCREENin is electrically stable with respect to the environment. This ensures good shielding, in particular when the current input is inserted into a typical automation current loop, which may consist of other signal sinks (current inputs of other components). The corresponding potential ratios and shielding properties are achieved on the receiver side with the inner shield 14*i* at output ground GNDout and the outer shield 14*a* at the potential SCREENout.

As only indicated in FIG. 1, the transfer rod 10 penetrates through the two double shields 13, 14 through narrow openings (see FIG. 4 at 44, 45) in order to minimize the impact on the shielding properties.

Figure 2:
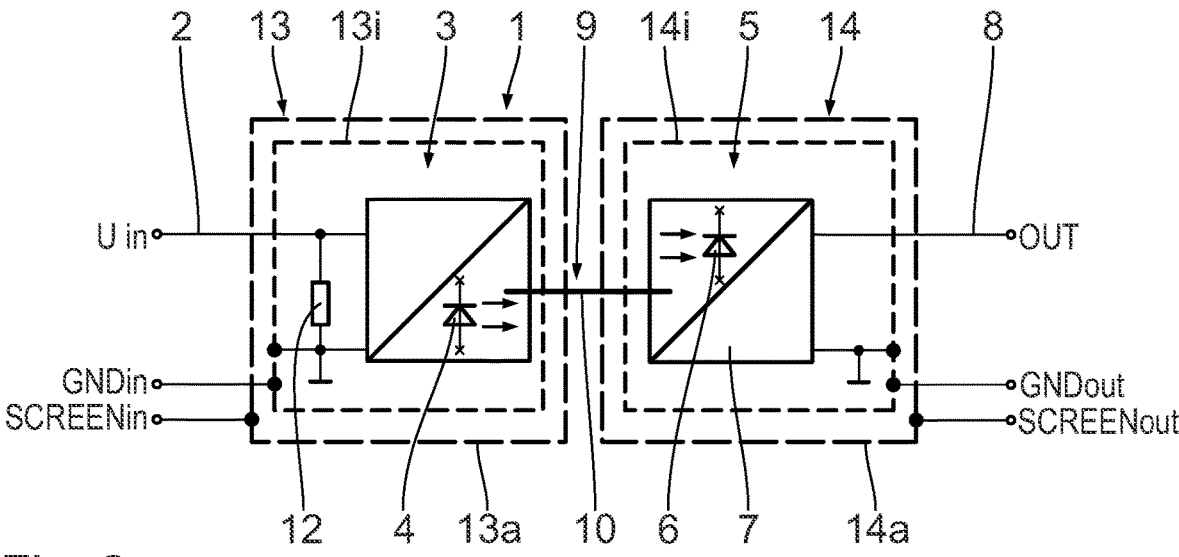

In FIG. 2, the signal transmission apparatus is shown in a configuration in which the signal input 2 is designed for voltage signals Uin. Accordingly, the input resistor 12 of the embodiment according to FIG. 1 can be omitted. Although two double shields 13, 14 are again shown in the embodiment according to FIG. 2, a single shielding with the shields 13*i*, 14*i* is often sufficient for voltage signal transmission. To avoid repetition, please refer to the description of FIG. 1 with regard to FIG. 2. Components that correspond to each other in the two drawings are labelled with the same reference signs.

Figure 3:
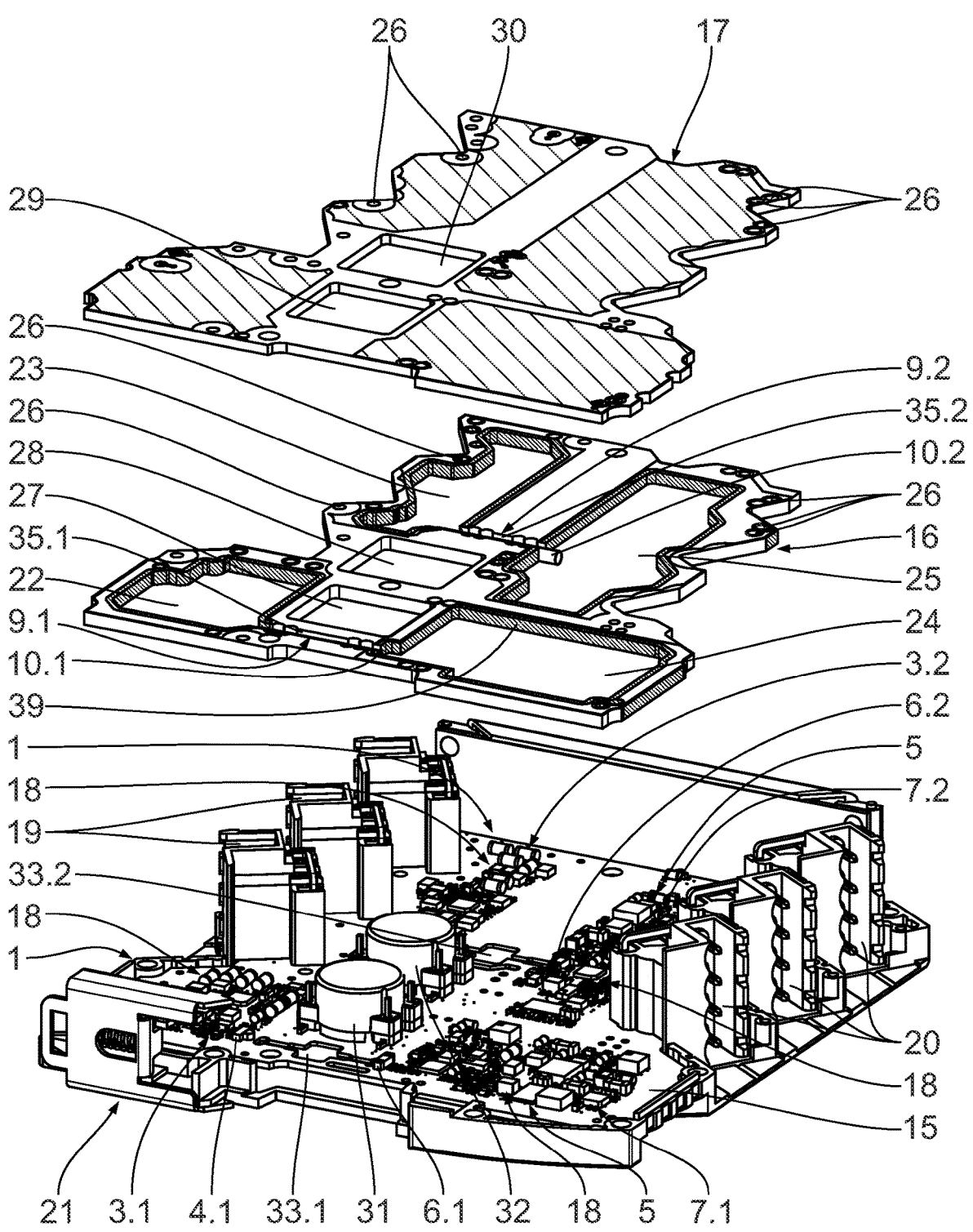
FIG. 3 shows an exploded view of the signal transmission apparatus in a first embodiment.
Figure 4:
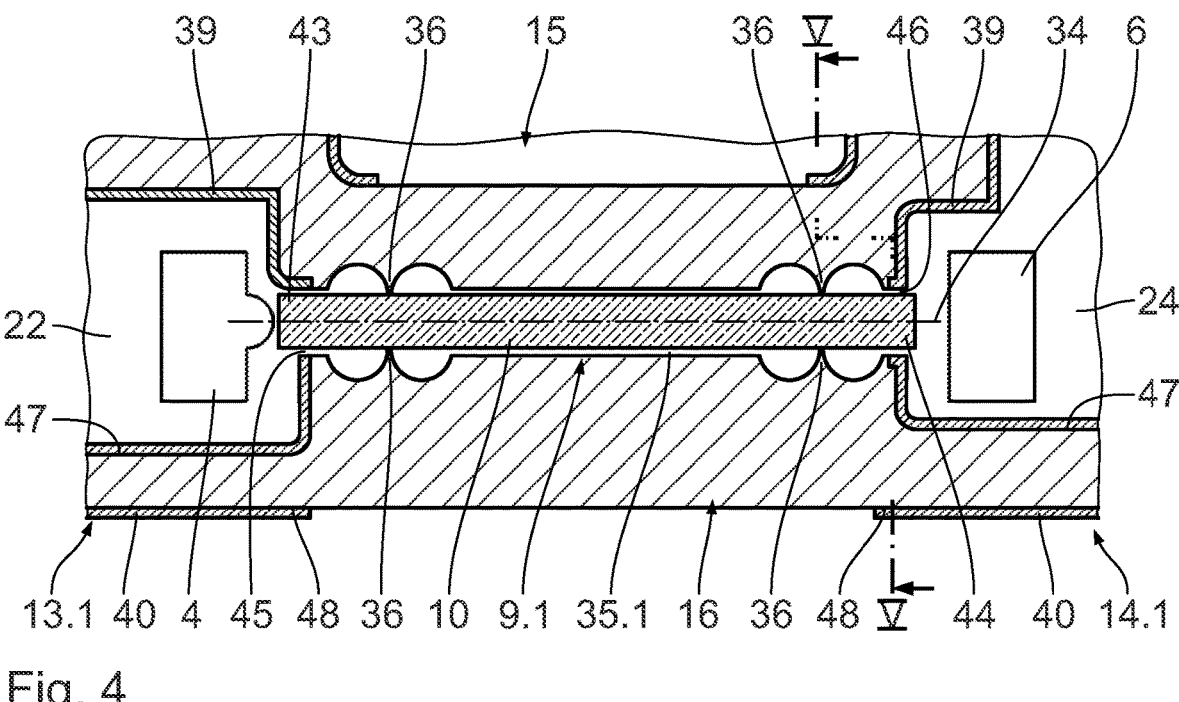
FIG. 4 shows a schematic horizontal section of the frame printed circuit board of this signal transmission apparatus.
Figure 5:
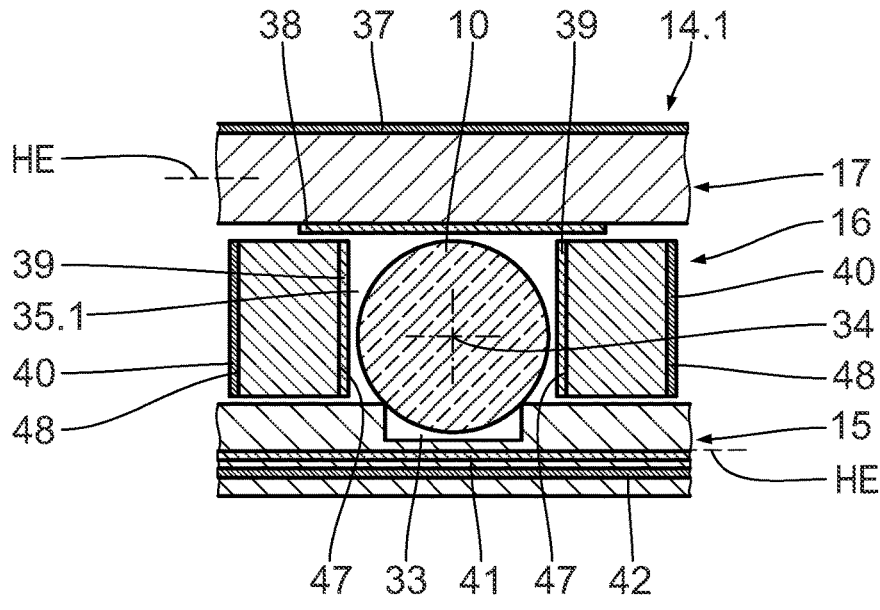
FIG. 5 shows a schematic vertical section of the signal transmission apparatus along the section line V-V according to FIG. 4.

FIGS. 3 to 5 now illustrate the specific structure of a potential-separating optical signal transmission apparatus, which is designed as a 2-channel transformer in the specific embodiment example. As can be seen from FIG. 3, the apparatus is characterized by the combination of three printed circuit boards which sit on top of each other, namely, viewed from bottom to top, a base printed circuit board 15, a frame printed circuit board 16 sitting on it and a cover printed circuit board 17 closing the whole at the top. On the base printed circuit board 15, all electronic components 18, which are not to be named individually, are usually placed according to SMD technology in the usual manner on corresponding conductor tracks and form the transmission signal conditioning circuit 3.1, 3.2 and the received signal processing circuit 7.1, 7.2 of the two channels. Furthermore, the input-side plug-in sockets 19 and output-side plug-in sockets 20 for the respective connection cables of the signal transmission apparatus are mounted and electrically connected on the base printed circuit board 15. FIG. 3 also shows a lower housing part 21 which, together with other housing parts omitted in the drawing, forms a housing of the signal transmission apparatus for receiving the printed circuit boards 15, 16, 17.

The frame printed circuit board 16 has four larger apertures 22, 23, 24, 25, the outline of which is adapted to the mounting space of the electronic components 18 of the transmission signal conditioning circuits 3.1, 3.2 and received signal processing circuits 7.1, 7.2 in such a manner that these circuits are positioned in these apertures 22, 23, 24, 25. The thickness of the frame printed circuit board 16 is such that the electronic components 18 do not protrude beyond the upper side of the frame printed circuit board 16. This allows the cover printed circuit board 17 to be placed flat on the frame printed circuit board 16 and the board assembly to be joined together in a hermetically sealed and mechanically stable manner using appropriate connectors, such as solder pins (not shown) in solder openings 26. By varnishing the outer surfaces and edges, a kind of sealing of the volumes containing the circuits 3.1, 3.2, 7.1, 7.2 can be achieved. The two smaller apertures 27, 28 in the frame printed circuit board 16 and thus congruent apertures 29, 30 in the cover printed circuit board 17 accommodate the two larger-volume, potential-separating transformers 31, 32, which are also located on the base printed circuit board 15, when assembled. These transformers transport electrical energy and are therefore used for the potential-separated power supply. For example, the transmitter can be supplied with power in a potential-separated manner if power is supplied via the receiver side. Accordingly, the reverse case is also possible, i.e. the potential-separated power supply of the receiver when the power is supplied via the transmitter side. The transformers are not included in FIGS. 1, 2, 4 and 5.

The specific configuration of the optical transmission paths 9.1, 9.2 with the two transfer rods 10.1, 10.2 of the two channels of the transmission apparatus is now described in more detail with reference to FIGS. 3 to 5. The LED signal transmitters 4.1 of the two channels (in FIG. 3, the LED signal transmitter 4.2 is concealed behind the transformer 31) and their signal receivers 6.1, 6.2 are arranged on the base printed circuit board 15 at the opposite ends of an alignment recess 33.1, 33.2 in each case in the surface of the base printed circuit board 15. The alignment recesses 33.1, 33.2 are dimensioned such that the respective transfer rod 10.1, 10.2 made of natural quartz glass, which measures approximately 20 mm in length and approximately 2 mm in diameter, comes to lie therein with its lower circular arc cross-section such that its optical axis 34 is precisely aligned with the signal output or input zones of the signal transmitters 4.1, 4.2 or signal receivers 6.1, 6.2. However, the actual mounting of the transfer rods 10.1, 10.2 is performed by the frame printed circuit board 16 with its recesses 35.1, 35.2 connecting the apertures 22, 24 and 23, 25 respectively, the inwardly projecting projections 36 (see FIG. 5) of which hold the respective transfer rod 10.1, 10.2 under a press fit.

From a synopsis of FIGS. 3 to 5, the double shields 13, 14 mentioned in connection with FIGS. 1 and 2 can now be explained in more detail. The respective transmission signal conditioning circuits 3.1, 3.2 and received signal processing circuits 7.1, 7.2 are surrounded on all sides by double shields 13.1, 14.1, which are configured by corresponding metallic layers in or on the base printed circuit boards 15, frame printed circuit boards 16 and cover printed circuit boards 17. The upper and undersides of the cover printed circuit board 17, which run parallel to the main board plane HE, each have hatched zones with a metallic layer 37 and 38, which coincide with the position of the circuits 3.1, 3.2, 7.1, 7.2. The layer 37 located on the upper side forms a section of the corresponding outer shield 14, the layer 38 located on the underside forms a section of the corresponding inner shield 13 of the two-layer shielding assemblies.

Further sections of the shields are formed at the bottom of the frame printed circuit board 16 by covering the vertical edges 47 of the apertures 22, 23, 24, 25 with a metallic layer 39 as a corresponding section of the inner shield 13*i*, 14*i* with respect to the main plane HE. Outer edges 48 of the frame printed circuit board 16 can also be coated with metallic layers 40 to form corresponding sections of the outer shield 13*a*, 14*a*.

To complete the inner shield 13*i*, 14*i* and outer shield 13*a*, 14*a*, two metallic layers 41 (for the inner shield 13) and 42 (for the outer shield 14) are again integrated in the base printed circuit board 15 by embedding them in an inner layer of the printed circuit board in congruent overlap with the zones marked with hatching on the cover printed circuit board 17 in FIG. 3. The various metallic layers 37 to 42 thus form two-layer shield assemblies around the transmission signal conditioning circuits 3.1, 3.2 and received signal processing circuits 7.1, 7.2 due to their mutual spatial allocation, which are only interrupted in the optical transmission paths 9.1, 9.2 by the transfer rods 10.1, 10.2 protruding with their ends 43, 44 through the metallic layers 39, 40 on the frame printed circuit board 16 via narrow openings 45, 46. Narrow gaps can also be formed in the shielding assemblies at the transitions of the metallic layers 38 to 42 between the various printed circuit boards 15, 16, 17, the negative effect of which can, however, be compensated for by overlapping the layers 37 to 42 in two adjacent printed circuit boards 15, 16, 17.

Finally, it should be pointed out that between the regions of the double-layered shields 13, 14 formed around the circuits 3.1, 3.2, 7.1, 7.2, a strip is formed between the transmitting and receiving sides of the transmission apparatus without metallic components, which strip is bridged only by the transfer rods 10.1, 10.2 in addition to the printed circuit board material and which strip plays a decisive role in determining the insulation distance of the apparatus.

A second embodiment of the signal transmission apparatus is now explained in more detail with reference to FIGS. 6 to 11, which second embodiment differs from the first embodiment essentially in the structure of the PCB-based housing. The basic circuit properties, as explained with reference to FIGS. 1 and 2, also apply to the second embodiment and therefore do not need to be repeated.

Figure 6:
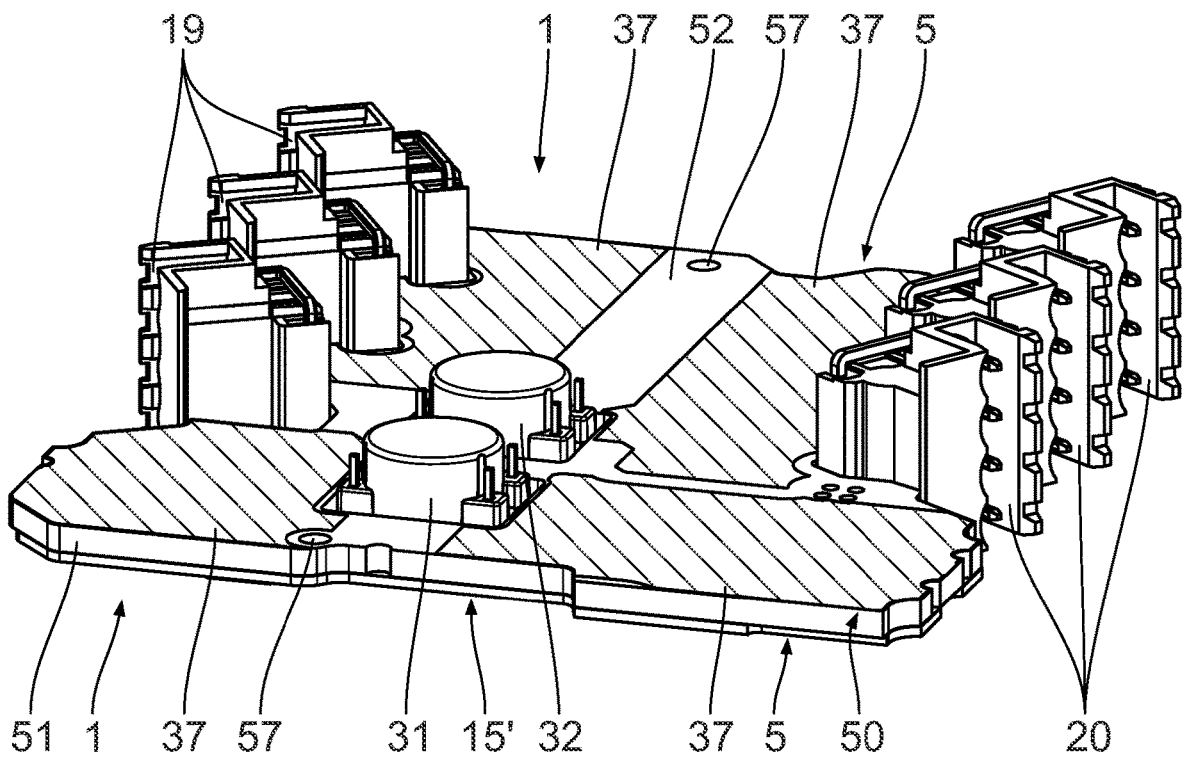
FIG. 6 shows a perspective view of a signal transmission apparatus in a second embodiment.
Figure 7:
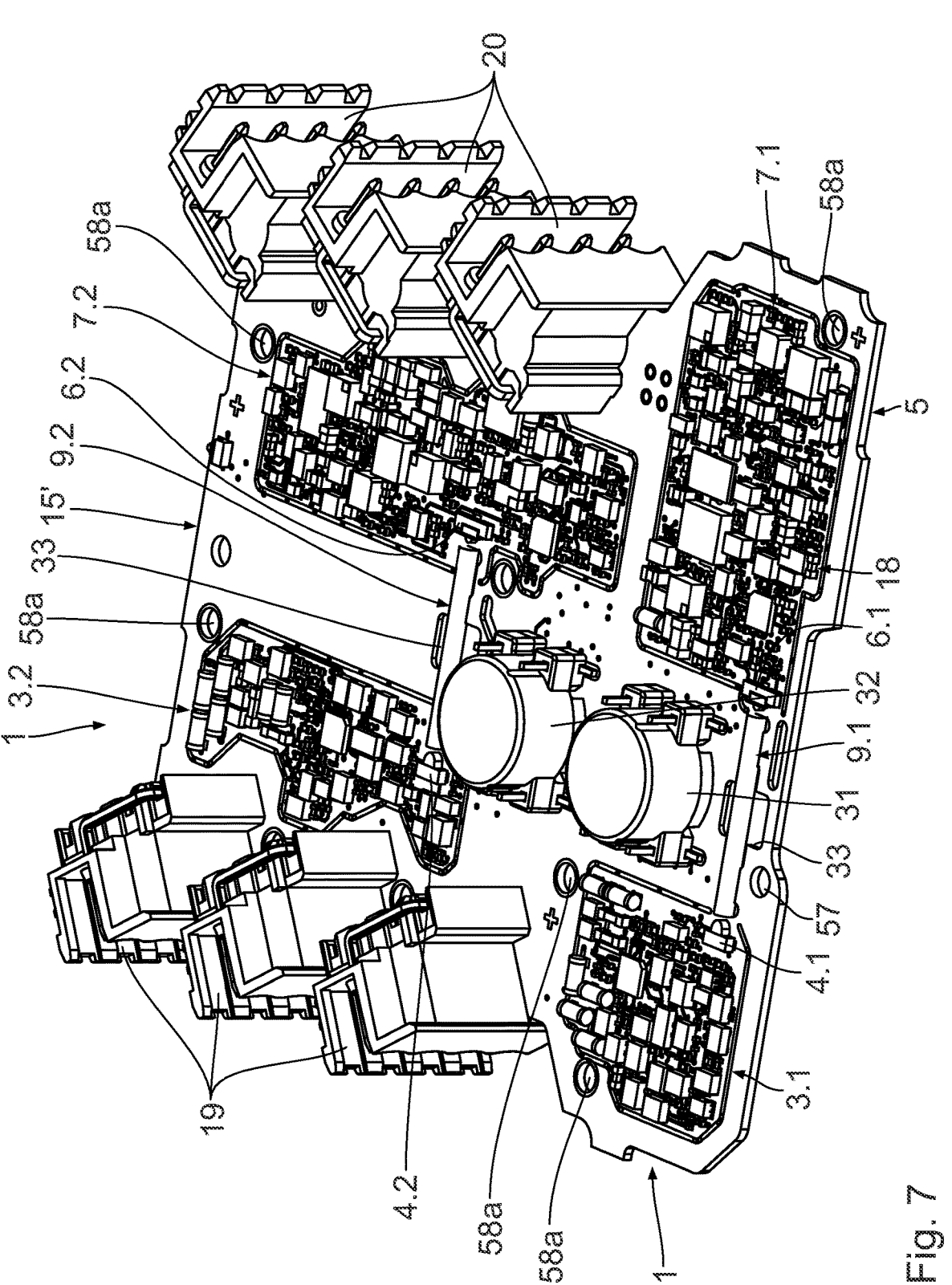
FIG. 7 shows a perspective view of the base printed circuit board of the signal transmission apparatus according to FIG. 6 with the cover printed circuit board lifted off.
Figure 8:
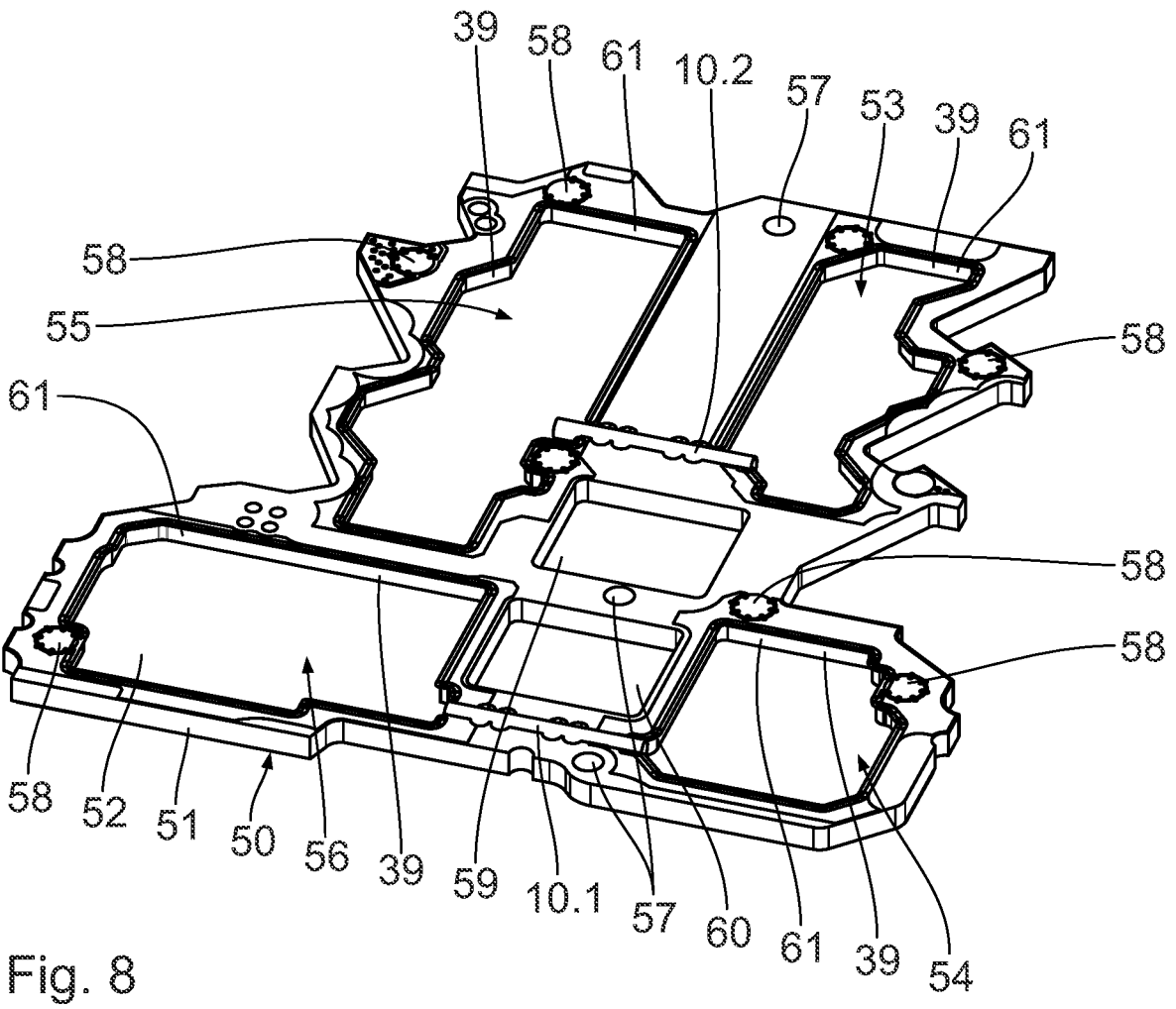
FIG. 8 shows a perspective view of the underside of the cap printed circuit board of the signal transmission apparatus according to FIG. 6.

The main difference in the second embodiment can be seen in FIGS. 6 to 8. A base printed circuit board 15' is still provided, which is equipped with electronic components 18 on the upper and undersides to form the transmission signal conditioning circuit 3.1, 3.2 and the received signal processing circuit 7.1, 7.2 of the two channels, as explained in the first embodiment example. Furthermore, the input-side plug-in sockets 19 and output-side plug-in sockets 20 for the respective connection cables of the signal transmission apparatus are again mounted and electrically connected on the base printed circuit board 15'. The lower part of the housing shown in FIG. 3 is omitted in FIGS. 7 and 8 for the sake of clarity.

In the second embodiment, instead of the frame printed circuit board 16 and cover printed circuit board 17, a one-piece cap printed circuit board 50 consisting of a thicker printed circuit board blank is provided, which has a circumferential frame flange 51 (analogous to the frame board 16 in the first embodiment) for laterally framing the circuit components 18 and a cover wall 52 (analogous to the cover board 17 in the first embodiment) for covering the circuit components 18 and the transfer rods 10.

As can be seen in particular from FIG. 8, the frame flange 51 delimits four larger recesses 53, 54, 55, 56 in the cap printed circuit board 50, the outline and height of which above the cover wall 52 is adapted to the mounting space of the electronic components 18 on the base printed circuit board 15' in such a manner that the circuits 3.1, 3.2, 7.1, 7.2 are positioned therein. Accordingly, the cap printed circuit board 50 can be placed flat on the base printed circuit board 15' and positioned precisely via centering holes 57 in the base printed circuit board 15' and cap printed circuit board 50 to accommodate guide pins for congruent guidance during the manufacturing process, for example in mounting, soldering or testing apparatuses. The cap printed circuit board 15 is also provided with apertures 59, 60 to accommodate the potential-separating transformers 31, 32 located on the base printed circuit board 15'. The cap printed circuit board 50 can be connected to the base printed circuit board 15' by soldering via metallized surfaces 58, metallized holes 58*a* and the edge metallization in the form of the metallic layers 39, 40.

Figure 9:
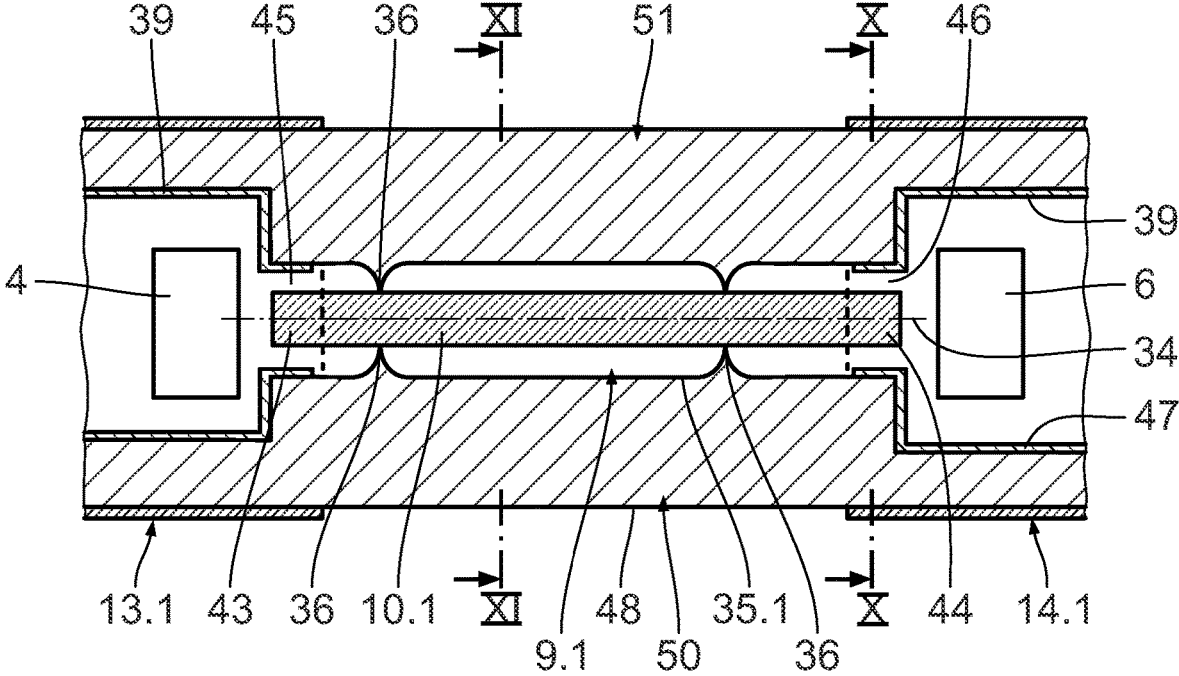
FIG. 9 shows a schematic sectional horizontal section of the cap printed circuit board according to FIG. 8 in the region of its frame flange.
Figure 10:
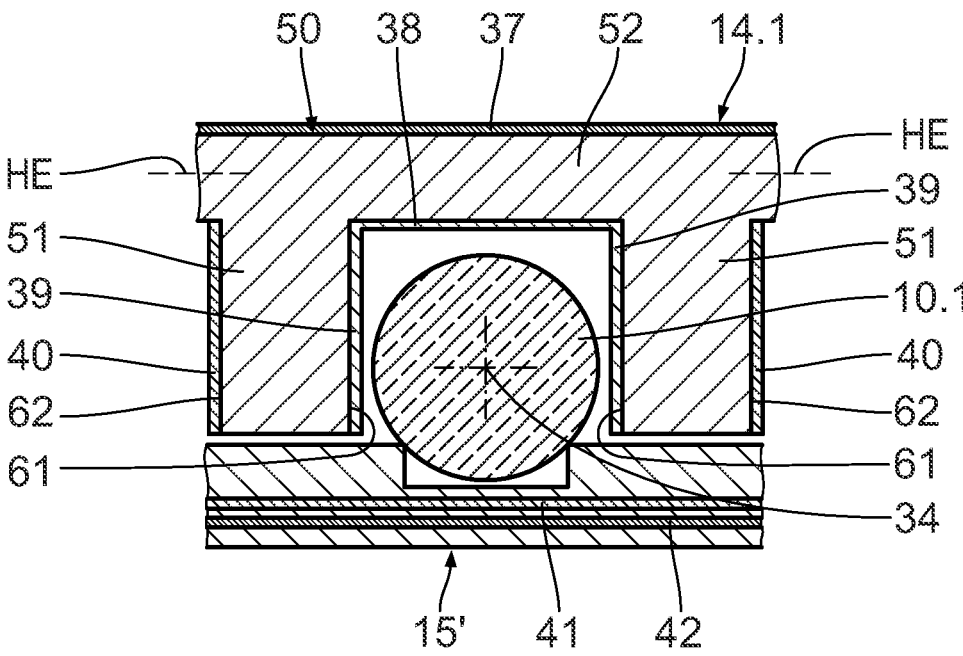
FIGS. 10 and 11 show schematic vertical sections of the signal transmission apparatus according to FIG. 6 along the section lines X-X and XI-XI according to FIG. 9.
Figure 11:
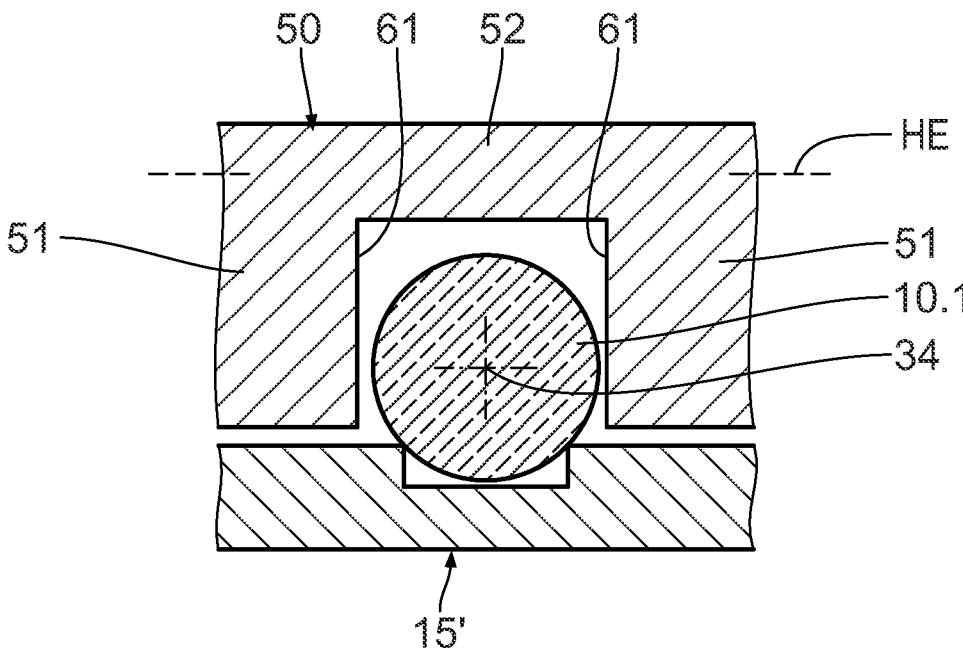

In the second embodiment, the optical transmission paths 9.1, 9.2 with the two transfer rods 10.1, 10.2 are arranged in the frame flange 51 in the same manner as in the first embodiment in the frame plate 16, as can be seen from a comparison of FIGS. 4 and 5 on the one hand with FIGS. 9 to 11 on the other hand. In this respect, reference can be made to the description of the first embodiment in order to avoid repetition, wherein corresponding components are provided with identical reference signs. It is merely pointed out that the transfer rod 10 (in both embodiments) can be designed to be shorter and its ends 43, 44 are already positioned in front of the shields 13.1, 14.1, as shown dashed in FIG. 9.

The double shields 13, 14 mentioned in connection with FIGS. 1 and 2 are also implemented in the second embodiment, analogous to the first embodiment, on the base printed circuit board 15', on the frame flange 51 and on the cover wall 52 of the cap printed circuit board 50 by means of metallic layers 37 to 42, as explained with reference to FIGS. 3 to 5. Their positioning and function essentially correspond to those of the first and second embodiments, so that for the description of the shielding of the second embodiment, as shown in FIGS. 6 to 10, reference can again be made to the relevant explanations of the first embodiment, using identical reference signs for identical components. It is merely noted for the sake of good order that—as can be seen in FIG. 10—the metallic layer 37 is applied to the upper side and the metallic layer 38 to the underside of the cover wall 52 of the cap printed circuit board 50. The metallic layers 39, 40 are arranged on the side edges 61, 62 of the frame flange 51, which run perpendicular to the main plane HE. The two metallic layers 41, 42 extend in the same manner in the base printed circuit board 15'.

With regard to the vertical section according to FIG. 11, it should be noted that the latter shows the central region of the optical transmission path 9 with the transfer rod 10, the base printed circuit board 15' and the cap printed circuit board 50 in the second embodiment example, which, analogous to the first embodiment example, has no shielding surfaces for optimum electrical isolation between the receiver and transmitter.

The invention claimed is:

1. A potential-separating optical signal transmission apparatus, comprising: a printed circuit board-based transmitter device with a signal input, a transmission signal conditioning circuit, and an optical signal transmitter; a printed circuit board-based receiver device with an optical signal receiver, a received signal processing circuit, and a signal output; an optical transmission path between the optical signal transmitter and the optical signal receiver in form of a substantially rigid, transparent transfer rod; and shield assemblies, including a transmitter shield assembly for the transmitter device and a receiver shield assembly for the receiver device, the shield assemblies being implemented by metallic layers in and/or on at least one printed circuit board, wherein a first end of the transfer rod is arranged shortly in front of or within the transmitter shield assembly in front of the optical signal transmitter, wherein a second end of the transfer rod is arranged shortly in front of or within the receiver shield assembly in front of the optical signal receiver, and wherein the transfer rod is mechanically held by the at least one printed circuit board, wherein the transparent transfer rod (10) has at least one of the following properties:

made of one of the group consisting of a highly transparent synthetic resin and glass, length between 10 mm and 100 mm, diameter 1 mm to 4 mm, distance of the signal input and output surfaces on a head side to the optical signal transmitter (4) and signal receiver (6) between 0.1 mm and 1 mm, and one of optical preparation and finishing of the signal input and output surfaces on the head side.

2. The signal transmission apparatus according to claim 1, wherein the signal transmission apparatus with the transmitter device, the optical transmission path and the receiver device is implemented by combining two printed circuit boards which sit on top of one another, namely a base printed circuit board including a majority of electronic circuit components thereon and a one-piece cap printed circuit board which has a circumferential frame flange for laterally framing the circuit components and a cover wall for covering the circuit components and the transfer rod.

3. The signal transmission apparatus according to claim 2, wherein the base printed circuit board and cover wall of the cap printed circuit board are provided with metallic layers arranged parallel to the main planes thereof and the frame flange of the cap printed circuit board is provided with an edge metallization comprising metallic layers.

4. The signal transmission apparatus according to claim 1, wherein the transfer rod lies in an alignment recess in a surface of the base printed circuit board.

5. The signal transmission apparatus according to claim 1, wherein the optical signal transmitter is designed as an LED.

6. The signal transmission apparatus according to claim 5, wherein ageing of the optical signal transmitter can be compensated for by adapting the LED current by means of an ageing compensation circuit based on a reference transmission path with a semiconductor-based light emitter.

7. The signal transmission apparatus according to claim 6, wherein the reference transmission path with the semiconductor-based light emitter is a reference LED transmission path.

8. The signal transmission apparatus according to claim 1, wherein the optical signal receiver is designed as one of the groups consisting of a CCD, phototransistor, photodiode and photoresistor.

9. The signal transmission apparatus according to claim 1, wherein one of the base, frame and cover printed circuit board and the base and cap printed circuit board are mechanically connected to one another in a sandwich structure.

10. The signal transmission apparatus according to claim 9, wherein one of the base, frame and cover printed circuit board and the base and cap printed circuit board are mechanically connected to one another by means of one of the group consisting of soldering pins, soldered edge mentalizations, press-fit pins, adhesions, pressings, screwing, riveting and welding.

11. A potential-separating optical signal transmission apparatus, comprising:

a printed circuit board-based transmitter device with a signal input, a transmission signal conditioning circuit, and an optical signal transmitter; a printed circuit board-based receiver device with an optical signal receiver, a received signal processing circuit, and a signal output; an optical transmission path between the optical signal transmitter and the optical signal receiver in form of a substantially rigid, transparent transfer rod; and shield assemblies, including a transmitter shield assembly for the transmitter device and a receiver shield assembly for the receiver device, the shield assemblies being implemented by metallic layers in and/or on at least one printed circuit board, wherein a first end of the transfer rod is arranged shortly in front of or within the transmitter shield assembly in front of the optical signal transmitter, wherein a second end of the transfer rod is arranged shortly in front of or within the receiver shield assembly in front of the optical signal receiver, and wherein the transfer rod is mechanically held by the at least one printed circuit board, wherein the signal transmission apparatus with the transmitter device, the optical transmission path and the receiver device is implemented by combining three printed circuit boards which sit on top of one another, namely a base printed circuit board including a majority of electronic circuit components thereon, a frame printed circuit board for laterally framing the circuit components, and a cover printed circuit board for covering the frame printed circuit board, the circuit components and the transfer rod.

12. The signal transmission apparatus according to claim 11, wherein the metallic layers of the shield assemblies for the transmitter and receiver device are arranged one of in and on the base, one of the frame and cover printed circuit board and the base and cap printed circuit board in such a manner that around the transmitter and receiver device with their respective electronic circuit components in each case at least one of single-layer and multi-layer is formed, which is penetrated by the transparent transfer rod on a side of one of the transmitter and receiver device.

13. The signal transmission apparatus according to claim 12, wherein the multi-layer shielding is a two-layer shielding.

14. The signal transmission apparatus according to claim 11, wherein the base printed circuit board and cover printed circuit board are provided with metallic layers arranged parallel to the main planes thereof and the frame printed circuit board is provided with an edge metallization comprising metallic layers.

15. The signal transmission apparatus according to claim 11, wherein the transparent transfer rod has at least one of the following properties:

made of one of the groups consisting of a highly transparent synthetic resin and glass, length between 10 mm and 100 mm, diameter 1 mm to 4 mm, distance of the signal input and output surfaces on a head side to the optical signal transmitter and signal receiver between 0.1 mm and 1 mm, and one of optical preparation and finishing of the signal input and output surfaces on the head side.

16. The signal transmission apparatus according to claim 15, wherein the transparent transfer rod is made of quartz glass.

17. The signal transmission apparatus according to claim 15, wherein the transparent transfer rod has a length of 20 mm.

18. The signal transmission apparatus according to claim 15, wherein the transparent transfer rod has a diameter of 2 mm.

19. The signal transmission apparatus according to claim 15, wherein the distance of the signal input and output surfaces on the head side to the optical signal transmitter and signal receiver is 0.5 mm.

20. The signal transmission apparatus according to claim 11, wherein the transfer rod is arranged in a recess of the frame printed circuit board and is held via projections of the frame printed circuit board by a press fit.

\* \* \* \* \*